(12) United States Patent
Goswami et al.

(10) Patent No.: US 7,886,203 B2
(45) Date of Patent: Feb. 8, 2011

(54) METHOD AND APPARATUS FOR BIT INTERLEAVING AND DEINTERLEAVING IN WIRELESS COMMUNICATION SYSTEMS

(75) Inventors: Debashis Goswami, Bangalore (IN); Geethanjali Rajegowda, Bangalore (IN)

(73) Assignee: Mindtree Consulting Ltd, Bangalore (IN)

(*) Notice: Subject to any disclaimer, the term of this patent is extended or adjusted under 35 U.S.C. 154(b) by 388 days.

(21) Appl. No.: 12/011,870

(22) Filed: Jan. 30, 2008

(65) Prior Publication Data
US 2009/0060068 A1   Mar. 5, 2009

(30) Foreign Application Priority Data
Sep. 5, 2007   (IN) .................. 1998/CHE/2007

(51) Int. Cl.
*G11C 29/00* (2006.01)
*H03M 13/03* (2006.01)
(52) U.S. Cl. ..................... 714/702; 714/787
(58) Field of Classification Search ............. 714/701, 714/702, 759, 787, 788, 776, 763, 723, 718, 714/704, 706; 711/157
See application file for complete search history.

(56) References Cited

U.S. PATENT DOCUMENTS

| | | | | |
|---|---|---|---|---|
| 5,592,492 A * | 1/1997 | Ben-Efraim et al. | ........ | 714/702 |
| 5,675,545 A * | 10/1997 | Madhavan et al. | ........ | 365/201 |
| 5,745,497 A * | 4/1998 | Ben-Efraim et al. | ........ | 714/702 |
| 7,278,070 B2 * | 10/2007 | Williams et al. | ........ | 714/701 |
| 7,600,164 B2 * | 10/2009 | Chen | ........ | 714/701 |
| 7,793,169 B2 * | 9/2010 | Huang | ........ | 714/701 |
| 2005/0152327 A1 | 7/2005 | Erlich | ........ | 370/343 |
| 2006/0093059 A1 * | 5/2006 | Skraparlis | ........ | 375/267 |
| 2006/0153311 A1 | 7/2006 | Xue | ........ | 375/262 |
| 2006/0164973 A1 | 7/2006 | Lee | ........ | 370/208 |
| 2007/0043982 A1 | 2/2007 | Arivoli | ........ | 714/701 |
| 2007/0101210 A1 * | 5/2007 | Huang | ........ | 714/701 |

* cited by examiner

*Primary Examiner*—Phung M Chung
(74) *Attorney, Agent, or Firm*—Ash Tankha

(57) ABSTRACT

Disclosed herein is a method and system for interleaving and deinterleaving of data bits in wireless data communications. Interleaving is performed as a single stage parallel operation using a single standard memory block. The disclosed method and system is capable of implementing different interleaving techniques, individually, or as a combination thereof. The disclosed system comprises a plurality of multiplexers, a standard memory block, read and write buses, control block, and a lookup table. The contents of the lookup table are generated based on an interleaving function. The data bits from the input bus and bits from the read bus of the memory are inputted to the plurality of multiplexers. Based on the lookup table's contents the multiplexers are switched to parallelly permute the input data bits and read bits from the read bus. The permuted data bits are in an interleaved sequence.

18 Claims, 18 Drawing Sheets

| 0 | 3 | 6 | 9 | 12 | 15 | 18 | 21 | 24 | 27 | 30 | 33 | 36 | 39 | 42 | 45 | 48 | 51 | 54 | 57 | 60 | 63 | 66 | 69 | 72 | 75 | 78 | 81 | 84 | 87 |
|---|---|---|---|---|---|---|---|---|---|---|---|---|---|---|---|---|---|---|---|---|---|---|---|---|---|---|---|---|---|
| 90 | 93 | 96 | 99 | 102 | 105 | 108 | 111 | 114 | 117 | 120 | 123 | 126 | 129 | 132 | 135 | 138 | 141 | 144 | 147 | 150 | 153 | 156 | 159 | 162 | 165 | 168 | 171 | 174 | 177 |
| 180 | 183 | 186 | 189 | 192 | 195 | 198 | 201 | 204 | 207 | 210 | 213 | 216 | 219 | 222 | 225 | 228 | 231 | 234 | 237 | 240 | 243 | 246 | 249 | 252 | 255 | 258 | 261 | 264 | 267 |
| 270 | 273 | 276 | 279 | 282 | 285 | 288 | 291 | 294 | 297 | 1 | 4 | 7 | 10 | 13 | 16 | 19 | 22 | 25 | 28 | 31 | 34 | 37 | 40 | 43 | 46 | 49 | 52 | 55 | 58 |
| 61 | 64 | 67 | 70 | 73 | 76 | 79 | 82 | 85 | 88 | 91 | 94 | 97 | 100 | 103 | 106 | 109 | 112 | 115 | 118 | 121 | 124 | 127 | 130 | 133 | 136 | 139 | 142 | 145 | 148 |
| 151 | 154 | 157 | 160 | 163 | 166 | 169 | 172 | 175 | 178 | 181 | 184 | 187 | 190 | 193 | 196 | 199 | 202 | 205 | 208 | 211 | 214 | 217 | 220 | 223 | 226 | 229 | 232 | 235 | 238 |
| 241 | 244 | 247 | 250 | 253 | 256 | 259 | 262 | 265 | 268 | 271 | 274 | 277 | 280 | 283 | 286 | 289 | 292 | 295 | 298 | 2 | 5 | 8 | 11 | 14 | 17 | 20 | 23 | 26 | 29 |
| 32 | 35 | 38 | 41 | 44 | 47 | 50 | 53 | 56 | 59 | 62 | 65 | 68 | 71 | 74 | 77 | 80 | 83 | 86 | 89 | 92 | 95 | 98 | 101 | 104 | 107 | 110 | 113 | 116 | 119 |
| 122 | 125 | 128 | 131 | 134 | 137 | 140 | 143 | 146 | 149 | 152 | 155 | 158 | 161 | 164 | 167 | 170 | 173 | 176 | 179 | 182 | 185 | 188 | 191 | 194 | 197 | 200 | 203 | 206 | 209 |
| 212 | 215 | 218 | 221 | 224 | 227 | 230 | 233 | 236 | 239 | 242 | 245 | 248 | 251 | 254 | 257 | 260 | 263 | 266 | 269 | 272 | 275 | 278 | 281 | 284 | 287 | 290 | 293 | 296 | 299 |

FIGURE 4D

| 0 | 10 | 20 | 30 | 40 | 50 | 60 | 70 | 80 | 90 | 1 | 11 | 21 | 31 | 41 | 51 | 61 | 71 | 81 | 91 | 2 | 12 | 22 | 32 | 42 | 52 | 62 | 72 | 82 | 92 |
|---|---|---|---|---|---|---|---|---|---|---|---|---|---|---|---|---|---|---|---|---|---|---|---|---|---|---|---|---|---|
| 3 | 13 | 23 | 33 | 43 | 53 | 63 | 73 | 83 | 93 | 4 | 14 | 24 | 34 | 44 | 54 | 64 | 74 | 84 | 94 | 5 | 15 | 25 | 35 | 45 | 55 | 65 | 75 | 85 | 95 |
| 6 | 16 | 26 | 36 | 46 | 56 | 66 | 76 | 86 | 96 | 7 | 17 | 27 | 37 | 47 | 57 | 67 | 77 | 87 | 97 | 8 | 18 | 28 | 38 | 48 | 58 | 68 | 78 | 88 | 98 |
| 9 | 19 | 29 | 39 | 49 | 59 | 69 | 79 | 89 | 99 | 100 | 110 | 120 | 130 | 140 | 150 | 160 | 170 | 180 | 190 | 101 | 111 | 121 | 131 | 141 | 151 | 161 | 171 | 181 | 191 |
| 102 | 112 | 122 | 132 | 142 | 152 | 162 | 172 | 182 | 192 | 103 | 113 | 123 | 133 | 143 | 153 | 163 | 173 | 183 | 193 | 104 | 114 | 124 | 134 | 144 | 154 | 164 | 174 | 184 | 194 |
| 105 | 115 | 125 | 135 | 145 | 155 | 165 | 175 | 185 | 195 | 106 | 116 | 126 | 136 | 146 | 156 | 166 | 176 | 186 | 196 | 107 | 117 | 127 | 137 | 147 | 157 | 167 | 177 | 187 | 197 |
| 108 | 118 | 128 | 138 | 148 | 158 | 168 | 178 | 188 | 198 | 109 | 119 | 129 | 139 | 149 | 159 | 169 | 179 | 189 | 199 | 200 | 210 | 220 | 230 | 240 | 250 | 260 | 270 | 280 | 290 |
| 201 | 211 | 221 | 231 | 241 | 251 | 261 | 271 | 281 | 291 | 202 | 212 | 222 | 232 | 242 | 252 | 262 | 272 | 282 | 292 | 203 | 213 | 223 | 233 | 243 | 253 | 263 | 273 | 283 | 293 |
| 204 | 214 | 224 | 234 | 244 | 254 | 264 | 274 | 284 | 294 | 205 | 215 | 225 | 235 | 245 | 255 | 265 | 275 | 285 | 295 | 206 | 216 | 226 | 236 | 246 | 256 | 266 | 276 | 286 | 296 |
| 207 | 217 | 227 | 237 | 247 | 257 | 267 | 277 | 287 | 297 | 208 | 218 | 228 | 238 | 248 | 258 | 268 | 278 | 288 | 298 | 209 | 219 | 229 | 239 | 249 | 259 | 269 | 279 | 289 | 299 |

FIGURE 4E

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|---|---|---|---|---|---|---|---|---|---|---|---|---|---|---|
| 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 |
| 60 | 61 | 62 | 63 | 64 | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 |
| 90 | 91 | 92 | 93 | 94 | 95 | 96 | 97 | 98 | 99 | 133 | 134 | 135 | 136 | 137 | 138 | 139 | 140 | 141 | 142 | 143 | 144 | 145 | 146 | 147 | 148 | 149 | 150 | 151 | 152 |
| 153 | 154 | 155 | 156 | 157 | 158 | 159 | 160 | 161 | 162 | 163 | 164 | 165 | 166 | 167 | 168 | 169 | 170 | 171 | 172 | 173 | 174 | 175 | 176 | 177 | 178 | 179 | 180 | 181 | 182 |
| 183 | 184 | 185 | 186 | 187 | 188 | 189 | 190 | 191 | 192 | 193 | 194 | 195 | 196 | 197 | 198 | 199 | 100 | 101 | 102 | 103 | 104 | 105 | 106 | 107 | 108 | 109 | 110 | 111 | 112 |
| 113 | 114 | 115 | 116 | 117 | 118 | 119 | 120 | 121 | 122 | 123 | 124 | 125 | 126 | 127 | 128 | 129 | 130 | 131 | 132 | 226 | 267 | 268 | 269 | 270 | 271 | 272 | 273 | 274 | 275 |
| 276 | 277 | 278 | 279 | 280 | 281 | 282 | 283 | 284 | 285 | 286 | 287 | 288 | 289 | 290 | 291 | 292 | 293 | 294 | 295 | 296 | 297 | 298 | 299 | 200 | 201 | 202 | 203 | 204 | 205 |
| 206 | 207 | 208 | 209 | 210 | 211 | 212 | 213 | 214 | 215 | 216 | 217 | 218 | 219 | 220 | 221 | 222 | 223 | 224 | 225 | 226 | 227 | 228 | 229 | 230 | 231 | 232 | 233 | 234 | 235 |
| 236 | 237 | 238 | 239 | 240 | 241 | 242 | 243 | 244 | 245 | 246 | 247 | 248 | 249 | 250 | 251 | 252 | 253 | 254 | 255 | 256 | 257 | 258 | 259 | 260 | 261 | 262 | 263 | 264 | 265 |

$$P_{ij} = \begin{Bmatrix} 0 & 30 & 10 & 40 & 20 & 0 & 30 & 10 & 40 & 20 & 3 & 33 & 13 & 43 & 23 & 3 & 33 & 13 & 43 & 23 & 6 & 36 & 16 & 46 & 26 & 6 & 36 & 16 & 46 & 26 & 9 & 39 & 19 & 49 & 29 & 9 & 39 & 19 & 49 & 29 & 12 & 42 & 22 & 2 & 32 & 12 & 42 & 22 & 2 & 32 \\ 15 & 45 & 25 & 5 & 35 & 15 & 45 & 25 & 5 & 35 & 18 & 48 & 28 & 8 & 38 & 18 & 48 & 28 & 8 & 38 & 21 & 1 & 31 & 11 & 41 & 21 & 1 & 31 & 11 & 41 & 24 & 4 & 34 & 14 & 44 & 24 & 4 & 34 & 14 & 44 & 27 & 7 & 37 & 17 & 47 & 27 & 7 & 37 & 17 & 47 \\ 0 & 30 & 10 & 40 & 20 & 0 & 30 & 13 & 43 & 23 & 3 & 33 & 13 & 43 & 23 & 3 & 33 & 16 & 46 & 26 & 6 & 36 & 16 & 46 & 26 & 6 & 36 & 19 & 49 & 29 & 9 & 39 & 19 & 49 & 29 & 9 & 39 & 22 & 2 & 32 & 12 & 42 & 22 & 2 & 32 & 12 & 42 & 25 & 5 & 35 \\ 15 & 45 & 25 & 5 & 35 & 15 & 45 & 28 & 8 & 38 & 18 & 48 & 28 & 8 & 38 & 18 & 48 & 1 & 31 & 11 & 41 & 21 & 1 & 31 & 11 & 41 & 21 & 4 & 34 & 14 & 44 & 24 & 4 & 34 & 14 & 44 & 24 & 7 & 37 & 17 & 47 & 27 & 7 & 37 & 17 & 47 & 27 & 10 & 40 & 20 \\ 0 & 30 & 10 & 40 & 23 & 3 & 33 & 13 & 43 & 23 & 3 & 33 & 13 & 43 & 26 & 6 & 36 & 16 & 46 & 26 & 6 & 36 & 16 & 46 & 29 & 9 & 39 & 19 & 49 & 29 & 9 & 39 & 19 & 49 & 2 & 32 & 12 & 42 & 22 & 2 & 32 & 12 & 42 & 22 & 5 & 35 & 15 & 45 & 25 & 5 \\ 35 & 15 & 45 & 25 & 8 & 38 & 18 & 48 & 28 & 8 & 38 & 18 & 48 & 28 & 11 & 41 & 21 & 1 & 31 & 11 & 41 & 21 & 1 & 31 & 14 & 44 & 24 & 4 & 34 & 14 & 44 & 24 & 4 & 34 & 17 & 47 & 27 & 7 & 37 & 17 & 47 & 27 & 7 & 37 & 20 & 0 & 30 & 10 & 40 & 20 \end{Bmatrix}$$

FIGURE 4H

LUT CONTENT

| N | INPUT BUS WIDTH 'b' | DEPTH OF MEMORY 'd' | WIDTH OF MEMORY 'w' | THROUGHPUT $T_i$= NUMBER OF BITS/CLOCK CYCLE |
|---|---|---|---|---|
| 1200 | 200 | 6 | 200 | 11 |
| 1200 | 100 | 6 | 200 | 5 |
| 1200 | 100 | 12 | 100 | 3 |
| 600 | 100 | 3 | 200 | 11 |
| 600 | 50 | 4 | 150 | 4 |
| 600 | 20 | 6 | 100 | 1 |

FIGURE 7A

| N | REGISTER WIDTH 'n' | DEPTH OF MEMORY 'd' | WIDTH OF MEMORY 'w' | THROUGHPUT $T_i$= NUMBER OF BITS/CLOCK CYCLE |
|---|---|---|---|---|
| 1200 | 200 | 6 | 200 | 28 |
| 1200 | 100 | 6 | 200 | 15 |
| 1200 | 100 | 12 | 100 | 8 |
| 600 | 100 | 3 | 200 | 28 |
| 600 | 50 | 4 | 150 | 11 |
| 600 | 20 | 6 | 100 | 3 |

FIGURE 7B

METHOD AND APPARATUS FOR BIT INTERLEAVING AND DEINTERLEAVING IN WIRELESS COMMUNICATION SYSTEMS

BACKGROUND OF THE INVENTION

This invention, in general, relates to bit interleaving and bit deinterleaving techniques in wireless communication systems and, in particular, refers to a method of interleaving and deinterleaving using a single stage implementation in application specific integrated circuits (ASIC).

Error correcting codes are employed to minimize digital data errors in wireless communication systems. The error correcting codes are usually effective in correcting errors randomly distributed in the data. However, errors in digital transmission usually come in bunches or "bursts", wherein a series of consecutive data bits are corrupted. Such channel burst errors frequently occur in wireless communication systems. The causes of these burst errors may be signal fading and channel impairment. Adopting an interleaving technique in conjunction with error correcting codes minimizes the effect of burst errors.

Bit-interleaving is a technique for rearranging the bit sequence of the transmitted data in a transmitter, prior to modulation. Upon receiving the data, a receiver restores the original bit sequence by a deinterleaving technique. The process of bit interleaving and deinterleaving effectively transforms the channel burst errors to random bit errors that may easily be corrected by error correcting codes.

Bit-interleaving is typically implemented in multiple stages to improve the interleaver robustness and performance. However, implementing a multistage bit interleaver is complex, as the multistage interleaving needs to be cascaded, wherein the output of one stage is provided as the input to the next stage.

In traditional interleaving methods, input bits are written into the memory sequentially one bit at a time and then read in the interleaved order. In multistage cascaded interleavers, the sequential mode of interleaving across various stages takes a large number of clock cycles to complete the interleaving operation.

Many interleaving methods use special memories that are written column by column and read row by row. These special memories include memory units organized into rows and columns, and are very complex to build in hardware.

Conventional interleavers and deinterleavers are usually specific to a particular type of interleaving and typically implement interleaving using complex hardware with special matrix memory blocks. The traditional methods implement the cascaded stages of interleaving separately. These methods employ different types of interleaving at each stage and results in increased hardware complexity. The traditional architectures may not be sufficiently scalable to meet high data rate demands.

Hence, there is an unmet need for a single stage bit interleaver that combines multiple stages of interleaving, is scalable to high data rates, has an efficient hardware implementation using standard memory blocks, and is capable of interleaving data using different interleaving techniques. The present invention relates to a bit-interleaver and deinterleaver architecture that addresses the above mentioned needs.

SUMMARY OF THE INVENTION

Disclosed herein is a method and system for combined stage bit interleaving and deinterleaving using a single standard memory block. The disclosed system used for interleaving and deinterleaving is generic to all types of interleaving techniques. Hence, different interleaving techniques can be individually implemented without making changes to the interleaver's architecture. In the disclosed method, a combination of different interleaving techniques is obtained in a single stage parallel implementation. In the single stage parallel implementation, the number of clock cycles to complete the interleaving operation is reduced; thereby obtaining a high data throughput from the interleaver. A single stage parallel implementation of interleaving also alleviates the need of having cascaded bit-interleaving stages, thereby reducing hardware complexity.

The method and system disclosed herein implements a multistage bit interleaver in a combined single stage, thereby reducing memory and hardware complexity. The interleaving operations use multiple bits at a time and process the multiple bits in parallel, thereby increasing the efficiency.

In contrast to special memories, a typical Random Access Memory (RAM) organizes data as bits arranged in rows. Such a memory can allow access to data in a row-wise manner only. The RAM is a standard building block in any ASIC, and has minimal hardware complexity. The interleaver architecture in the system disclosed herein uses a standard RAM, resulting in reduced hardware complexity.

The disclosed bit interleaving method employs a parallel architecture. The number of bits to be processed in parallel is chosen based on the performance requirements. To obtain a higher data rate, an increased number of bits can be processed in parallel.

The system disclosed herein is for a generic bit-interleaver used in wireless communication systems. The disclosed system for bit-interleaving is independent of the wireless communication systems and is adapted to implement the bit interleaving mechanisms in Ultra-Wideband (UWB), wireless local area network (WLAN), worldwide interoperability for microwave access (Wi-Max), etc., without requiring changes to be made to the disclosed system.

The disclosed system for bit-interleaving and bit deinterleaving is scalable to support high data transfer rates by changing the depth and width of the memory block, and the data size of the read bus or write bus and input bus.

The disclosed system comprises a plurality of multiplexers, a standard memory block, input and output buses, lookup table, address decoder and control block. The contents of the lookup table are generated based on the interleaving function. Data bits are inputted to the plurality of multiplexers through an input bus. Based on the lookup table's contents, the multiplexers are switched to parallelly. permute the input data bits. The permuted data bits are written into the interleaver memory through the write bus of the standard memory block. Each time an input is provided to the interleaver, the previously written permuted data bits are read from the standard memory block through the read bus, and the output of the multiplexers is written into the standard memory block through the write bus. The read and write operations are performed to every location of the standard memory, each time the input is provided to the interleaver.

BRIEF DESCRIPTION OF THE DRAWINGS

The foregoing summary, as well as the following detailed description of the embodiments, is better understood when read in conjunction with the appended drawings. For the purpose of illustrating the invention, exemplary constructions of the invention are shown in the drawings. However, the invention is not limited to the specific methods and instrumentalities disclosed herein.

FIG. 4D illustrates a sample output sequence provided by a symbol interleaver for a case in particular with an interleaver size of 300 bits.

FIG. 4E illustrates a sample output sequence provided by a tone interleaver for a case in particular with an interleaver size of 300 bits.

FIG. 4F illustrates a sample output sequence provided by a cyclic interleaver for a case in particular with an interleaver size of 300 bits.

FIG. 4G illustrates the output sequence generated from a combination of symbol interleaving, tone interleaving and cyclic interleaving implemented by the first and second architectures of interleavers.

FIG. 4H illustrates the indexes of the input bus connected to the multiplexers of the first architecture of the interleaver.

FIG. 4I illustrates the contents of the lookup table used in the first architecture for combined stage parallel interleaving.

FIG. 7A illustrates the performance of the first interleaver architecture for combined stage parallel interleaving.

FIG. 7B illustrates the performance of the second interleaver architecture for combined stage parallel interleaving.

DETAILED DESCRIPTION OF THE DRAWINGS

Figure 1A:
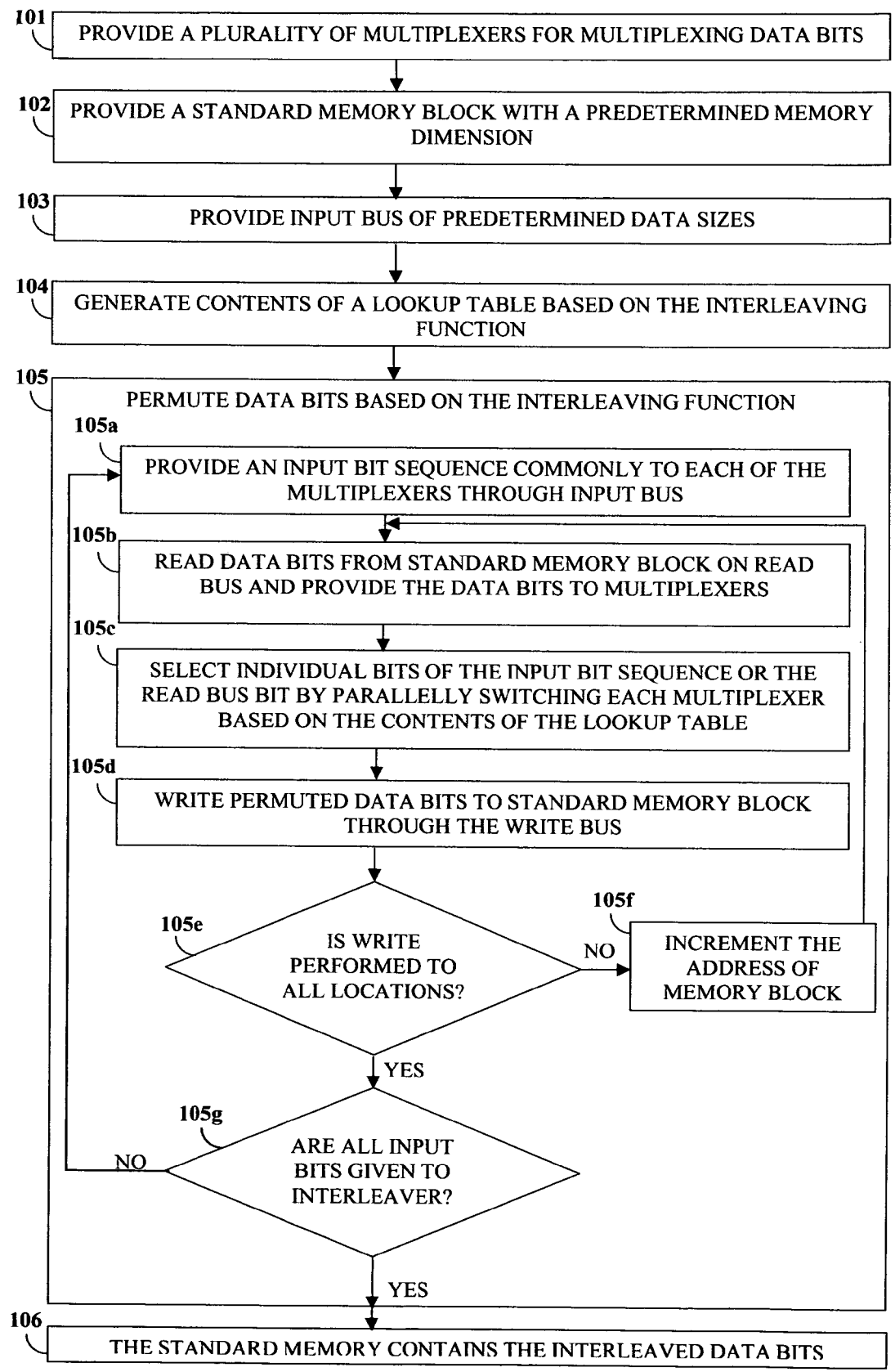
FIG. 1A illustrates a method of a first architecture for single stage parallel interleaving of data bits in wireless data communication.

FIG. 1A illustrates a method of a first architecture for single stage parallel interleaving of data bits in wireless data communication. The wireless data communication may comprise a generic Orthogonal Frequency-Division Multiplexing (OFDM) based communication system.

The disclosed method for single stage parallel interleaving of data bits is implemented by providing a plurality of multiplexers 402 for multiplexing the data bits 101. The plurality of multiplexers 402 performs interleaving of the data bits. A single standard memory block 401 of a predetermined memory dimension is provided to store the data bits 102. An input bus 408 of predetermined data size is provided 103. For permuting the data bits, firstly, the contents of a lookup table 403 are generated based on the interleaving function 104. The input bus 408 transfers the data bits commonly to each of the plurality of multiplexers 402. The write bus 407 is used to write the multiplexed data bits obtained from the plurality of multiplexers 402 to the standard memory block 401. The data bits transferred from the input bus 408 to the multiplexers 402 are permuted 105 based on an interleaving function to obtain an interleaved sequence. An input bit sequence that is a part of the input data bits is commonly provided 105a to each of the plurality of multiplexers 402 through the input bus 408. The data bits are read 105b from the standard memory block 401 on the read bus 406 and provided to the plurality of multiplexers 402. The individual bits of the input bit sequence are selected 105c by switching each of the multiplexers 402 in parallel, based on the contents of the lookup table 403. The permuted bit sequence is written 105d row wise to the standard memory block 401 through the write bus 407. The step of reading bits from the standard memory block 401 and writing the multiplexed data bits based on the lookup table's contents is repeated for all the locations of the memory 105e. The steps of 105a through 105e are repeated until all the input bits are interleaved 105g. The steps of 105a through 105e are repeated by incrementing the address of the standard memory block 105f. The interleaved bits can be read from the memory row-wise 106 on the output bus 410. The detailed description of FIG. 4A further describes the first interleaving architecture of the invention in detail.

Figure 1B:
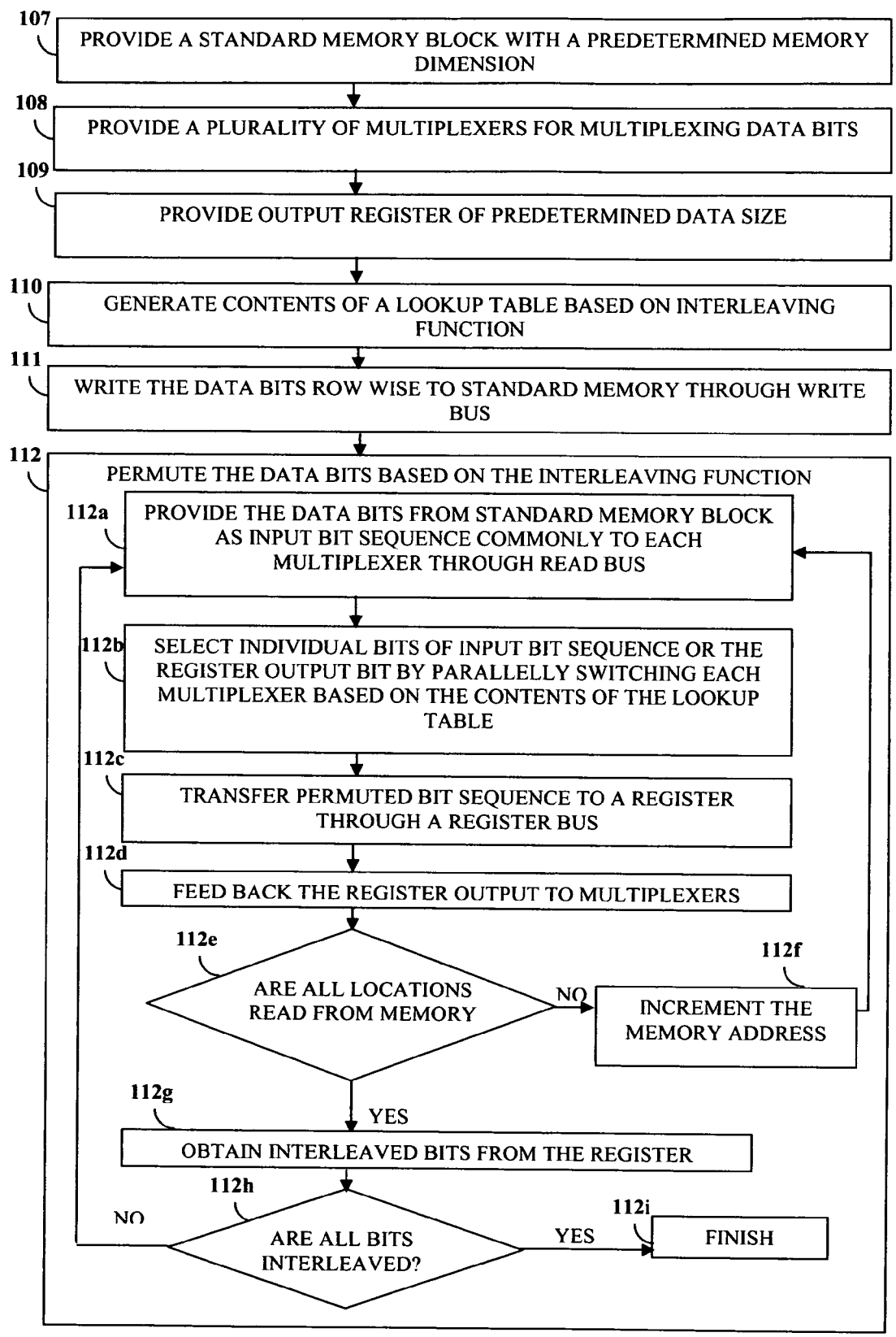
FIG. 1B illustrates a method of a second architecture for single stage parallel interleaving of data bits in wireless data communication.

FIG. 1B illustrates a method of a second architecture for single stage parallel interleaving of data bits in wireless data communication. The method of the second architecture is implemented by providing a standard memory block 401 with a predetermined memory dimension 107, a plurality of multiplexers 402 for multiplexing the data bits 108, and an output register 411 of predetermined data size 109. For the permutation of the data bits, the contents of a lookup table 403 are generated based on the interleaving function 110. The second architecture uses the input data that appears in a burst, as an input for the bit-interleaver. The burst data is written row wise 111 to the standard memory block 401 through the write bus 407. The written data bits are permuted 112 based on an interleaving function while being read from the standard memory block 401. The data bits from the standard memory block 401 is commonly provided as an input bit sequence 112a to each of the multiplexers 402 through the read bus 406. The data bits of the input bit sequence are selected by parallelly switching 112b each of the multiplexers 402 based on the contents of the lookup table 403. The permuted bit sequence is transferred 112c to the output register 411. The register's output is fed back to the input of the multiplexers 112d. The steps from 112a through 112d are repeated to all the rows of the memory 112e by incrementing the address 112f of the memory. At the end of the interleaving operation, the interleaved bits can be obtained 112g from the register 411. The detailed description of FIG. 5A further describes the second interleaving architecture of the invention in detail. The steps from 112a through 112g are repeated until all the bits are interleaved 112h.

Figure 2:
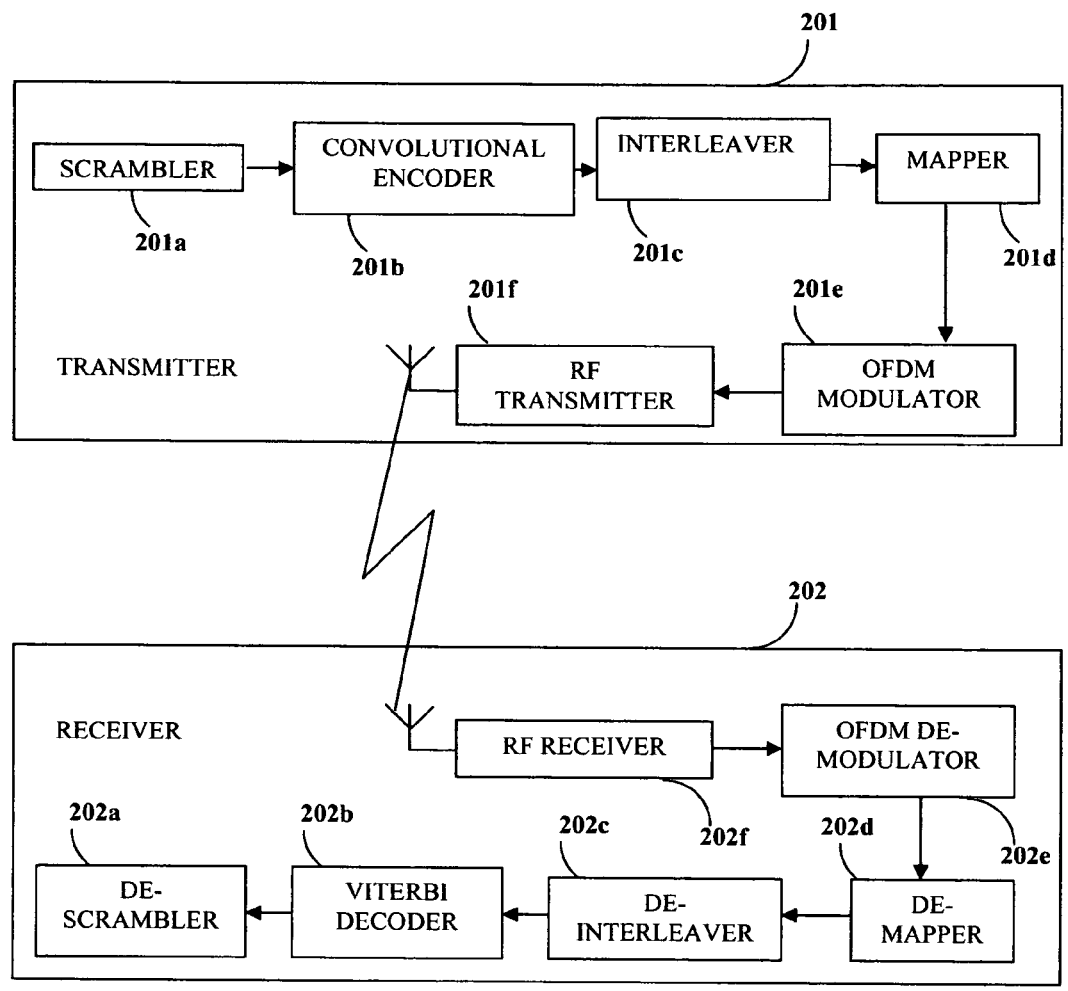
FIG. 2 illustrates a block diagram of a transmitter and a receiver for a typical Orthogonal Frequency-Division Multiplexing (OFDM) based wireless communication.

FIG. 2 illustrates a block diagram of a transmitter 201 and a receiver 202 for a typical Orthogonal Frequency-Division Multiplexing (OFDM) based wireless communication. A transmitter 201 circuit comprises a scrambler 201a, a convolutional encoder 201b, an interleaver 201c, a mapper 201d, an OFDM modulator 201e, and a radio frequency transmitter 201f. A scrambler 201a is a device that scrambles all the bits in the data field to randomize the bit patterns in order to avoid long streams of 1's and 0's. The convolutional encoder 201b adds redundant bits into the transmitted signal that helps in removing the random bit errors during reception. The interleaver 201c interleaves the coded bits prior to modulation to minimize the effect of burst errors. The mapper 201d maps data on to the subcarrier according to a constellation. An OFDM modulator 201e employs a digital multi-carrier modulation scheme for modulating the data to be transmitted.

A receiver 202 circuit comprises a descrambler 202a, a viterbi decoder 202b, a deinterleaver 202c, a demapper 202d, an OFDM demodulator 202e, and a radio frequency receiver 202f. A descrambler 202a is used to retrieve the data bits that are scrambled by the scrambler 201a of the transmitter. Viterbi decoder 202b uses the redundant bits added by the convolutional encoder and corrects the errors in the received signal. The deinterleaver 202c permutes the received bits in an order opposite to that of the interleaver. The demapper 202d on the receiver side extracts the phase and magnitude of each carrier. The OFDM demodulator 202e is employed to demodulate the signals received from a transmitter 201.

The interleaver 201c interleaves the data bits to be transmitted using a particular interleaving technique. Using a corresponding deinterleaving technique, the deinterleaver 202c deinterleaves the received data bits. The types of bit interleaving used in a wireless communication may comprise symbol interleaving, tone interleaving, cyclic interleaving, and block interleaving. The interleaving technique used in the interleaver 201c may be one of the above mentioned types of interleaving or any combination thereof.

Figure 3A:
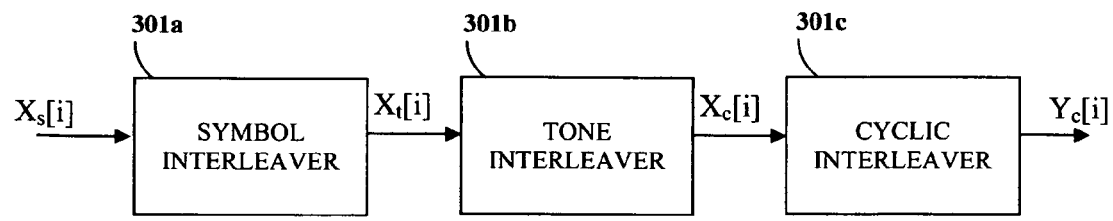
FIG. 3A illustrates a block diagram of a multistage combined interleaver used in an Orthogonal Frequency-Division Multiplexing (OFDM) based communication system using cascaded multiple interleaving stages.

Consider a multistage interleaver used in an OFDM based communication system using cascaded multiple interleaving stages as shown in FIG. 3A. The multistage interleaver using cascaded multiple interleaving stages comprises a symbol interleaver 301a, a tone interleaver 301b and a cyclic interleaver 301c.

Consider a symbol interleaver interleaving bits across '$m_s$' consecutive OFDM symbols each having a length of 'S' bits. The interleaved output will be:

$$y_s[n]=x_s[f_s(n)],\qquad\text{Equation 1:}$$

Where $f_s(n)=\text{floor }(n/S)+ms*\text{modulo }(n,S)$,
n=0,1 ... N−1, and N=(S*$m_s$), $y_s$ is the output bit stream and $x_s$ is the input bit stream of the symbol interleaver respectively.

Consider a tone interleaver that interleaves bits with spacing of '$m_t$' across tones within an OFDM symbol having a length of 'S' bits.

$$y_t[n]=x_t[f_t(n)],\qquad\text{Equation 2:}$$

Where $f_t(n)=\text{floor }(n/T)+m_t*\text{modulo }(n,T)$,
n=0,1 ... S−1, and T=(S/$m_t$), $y_t$ is the output bit stream and $x_t$ is the input bit stream of the tone interleaver respectively.

Consider a cyclic interleaver that cyclically interleaves bits across tones within an OFDM symbol. The shift will be k* $m_c$ for the $k^{th}$ symbol, '$m_c$' being the shifting parameter.

$$y_c[n]=x_c[f_c(n)]\qquad\text{Equation 3:}$$

Where $f_c(n)=\text{modulo }(n+k*m_c, S)$,
where n=0,1 ... S−1, k is greater than or equal to 0, $y_c$ is the output bit stream and $x_c$ is the input bit stream of the cyclic interleaver respectively.

Consider the combined interleaver comprising of symbol, tone and cyclic interleaving. The interleaving of bits can be represented as $$y[n]=x[f_c(f_t(f_s(n)))]\qquad\text{Equation 4:}$$

Where $f_s$, $f_t$, $f_c$ represent symbol interleaving, tone interleaving and cyclic interleaving functions respectively, n=0, 1, ..., N−1 for an interleaver of size N bits.
x[n] and y[n] are the input and output sequences respectively.

Figure 3B:
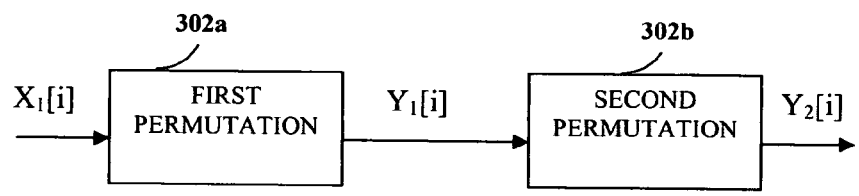
FIG. 3B illustrates a block diagram of an interleaver used in another Orthogonal Frequency-Division Multiplexing (OFDM) based Wireless Local Area Network (WLAN) communication system.

Consider a block diagram of an interleaver that is typically used in an OFDM based Wireless LAN (WLAN) communication system shown in FIG. 3B. Block interleaving is performed as a two-stage permutation cascaded one after another. The first stage 302a and the second stage 302b of the two stage permutation is shown in FIG. 3B. Consider data of block size of 'S' bits input to the block interleaver. The first stage of interleaving is represented by the equation below for 'S' bits of an OFDM symbol:

$$y_1[n]=x_1[f_1(n)],\qquad\text{Equation 5:}$$

where $f_1(n)=\text{floor}(n/B)+m_t*\text{modulo}(n,B)$,
n=0,1, ... S−1, B=S/$m_t$ and $x_1[n]$, $y_1[n]$ are the input and output bit-streams of the first stage 302a of block interleaver respectively.

The second stage of interleaving is represented by the equation below:

$$y_2[n]=x_2[f_2(n)],\qquad\text{Equation 6:}$$

where $f_2(n)=b*\text{floor}(n/b)+\text{modulo}((n+S-\text{floor}(16*n/S)),b)$
n=0,1, ... S−1, and b=max(P/2,1), P being number of bits per subcarrier $x_2[n]$ and $y_2[n]$ are the input and output bit-streams of the second stage 302b of block interleaver respectively.

Figure 4A:
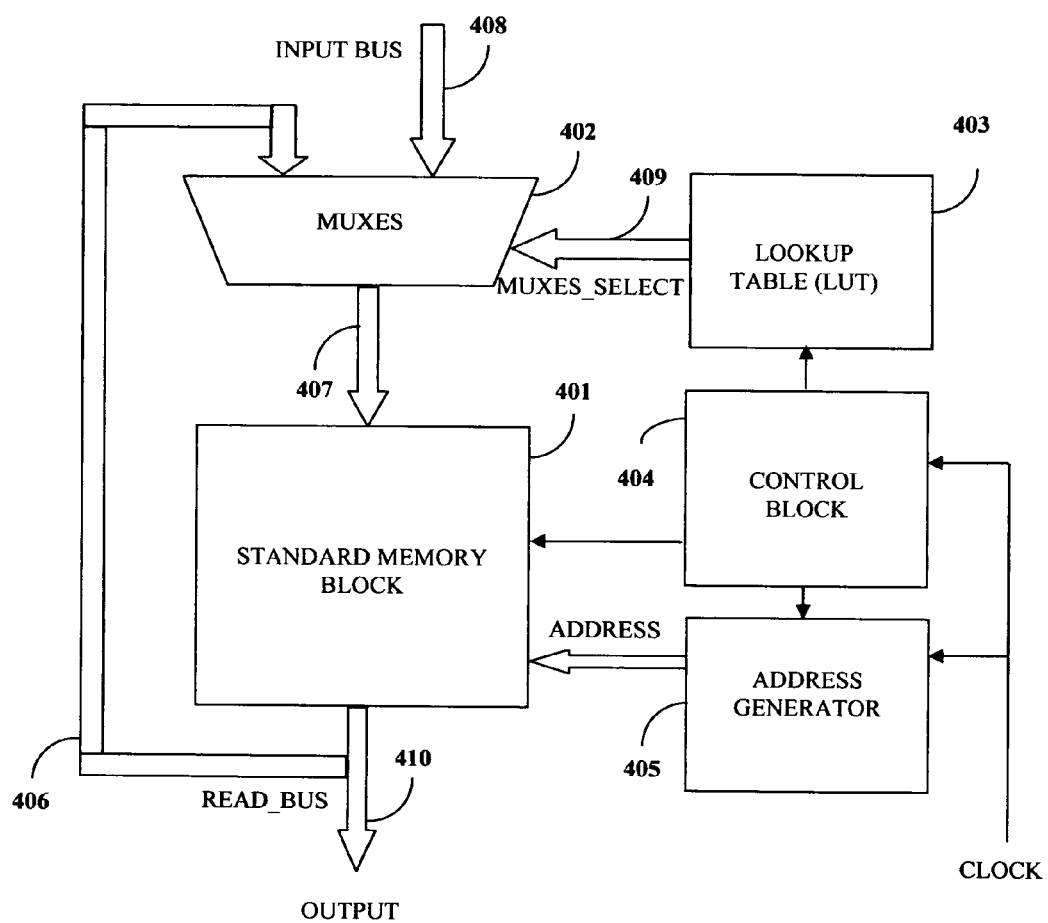
FIG. 4A illustrates an exemplary first architecture of the system for parallel interleaving of data bits by a combined single stage implementation of different types of interleaving techniques.

FIG. 4A illustrates an exemplary first architecture of the system for parallel interleaving of data bits by a combined single stage implementation of different types of interleaving techniques. The interleaving architecture comprises a single standard memory block 401, a plurality of multiplexers 402 connected to a common write bus 407, an address generator 405, and a lookup table (LUT) 403. The standard memory block 401 has a depth 'd' and width 'w' bits. The input bits to be interleaved are inputted to the multiplexers 402 through an input bus 408 of width 'b'. Width 'b' of the input bus 408 may be less than or equal to the width 'w' of the standard memory block 401. The multiplexers 402 also receive an input from the read bus 406 of the memory. The output of the multiplexers 402 are written into the standard memory block 401 through the write bus 407. The multiplexers 402 get select inputs from the lookup table 403. Depending on the select input 409, the output of the multiplexer 402 is either a bit from the input bus 408 or a bit from the read bus 406 provided to the multiplexer 402. The address for accessing various locations of the standard memory block 401 is provided by the address generator 405. The address generator 405 comprises an address generating counter (AG-COUNTER) 412 that counts up to depth 'd' of the memory. The control input for the address generator 405, lookup table 403, and the standard memory block 401 is provided by the control block 404.

The size of the standard memory block 401 is equal to the number of bits to be interleaved and is denoted by 'N'. The number of bits to be interleaved is equal to the product of the depth 'd' and the width 'w' of the standard memory block 401. The total number of bits to be interleaved 'N' is an integral multiple 'K' of the input bus width 'b' i.e. 'N'=b*K, where 'K' is an integer. The total number of multiplexers 402 required is 'w', where each multiplexer 402 is allotted with 'd+1' number of inputs. Hence each of the plurality of multiplexers 402 has a select input of width 'q' bits that is equal to ceil $[\log_2(d+1)]$. The number of entries in the lookup table 403 is given by 'L', where L=K*d. The width of the lookup table 403 is q*w bits.

The bit sequence is provided commonly to the plurality of multiplexers 402 through the input bus 408. Based on the contents of the lookup table 403, select inputs are used to switch the multiplexers 402 thereby selecting individual bits in a permuted sequence from the common input bit sequence. The permuted bit sequence is generated by a predefined interleaving function f(n) mapped in the lookup table 403. The permuted bit sequence is written row wise into the standard memory block 401, through the write bus 407. The read bus 406 is provided to read the written multiplexed bit sequence from the standard memory block 401. The address generator 405 generates memory address specifying the read and write locations for reading and writing the permuted bit sequence. The AG-COUNTER 412 in the address generator 405 is incremented as the row of memory locations is filled. The control block 404 provides a chip select, a read enable, and a write enable signals for the standard memory block 401.

Figure 4B:
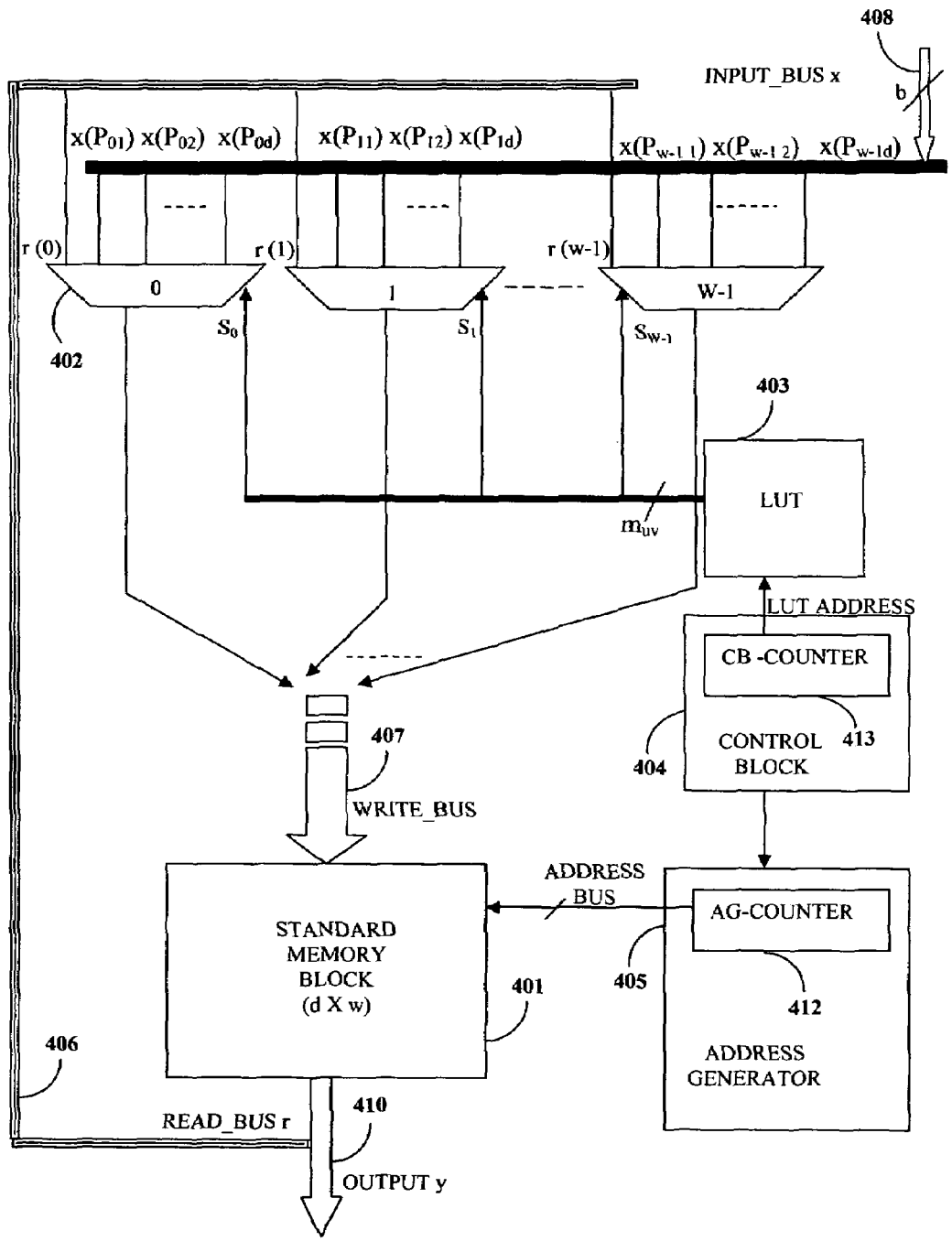
FIG. 4B shows the detailed diagram of the first architecture for bit-interleaving in a wireless-communication system.

FIG. 4B shows the detailed diagram of the first architecture for bit-interleaving in wireless communication system. Consider an interleaver apparatus with 'w' number of multiplexers 402. The multiplexers 402 are provided with inputs from both the input bus 408 and the read bus 406. The indexes of the input bus 408 connected to the multiplexers 402 are, $P_{01}, P_{02}, P_{03} \ldots, P_{0d}$ for multiplexer 0; $P_{11}, P_{12}, P_{13} \ldots, P_{1d}$ for multiplexer 1; and so on. The first input to any of the multiplexers in the plurality of multiplexers 402 is always the corresponding bit from the read bus 406 shown as r(0), r(1), ..., r(w−1) in FIG. 4B. The input sequence of an N-bit interleaver is x[0],x[1], ..., x[N−1]. The output sequence of an N-bit interleaver is y[0],y[1], ..., y[N−1]. The input and output bit sequences are interrelated by the interleaving function f(n). The interrelation is expressed as y[n]=x[f (n)], where n=0, 1, 2, ..., N−1, y [n] is the output bit sequence and x [n] is the input bit sequence. The indexes of the input bus connected to the multiplexers 402 is given by $P_{ij}$=modulo $(f[(j-1)*w+i], b)$,    Equation 7:

for $j^{th}$ input of the $i^{th}$ multiplexer, where i=0,1,2,..., w−1 and j=1,2,..., d. The lookup table 403 provides the select inputs $S_0, S_1, S_2 \ldots, S_{w-1}$ to the multiplexers 402 numbered from 0 through w−1 respectively. The select input set $m_{uv}$ indicates the select input for the multiplexers 402 while writing to the $v^{th}$ location of the memory for the $u^{th}$ input data bits provided to the interleaver. The select, input for the $i^{th}$ multiplexer $S_i$ is generated based on the equation below, if the condition $(u*b) \leq f(i+w*v) < (u+1)*b$ is true,    Equation 8:

then $S_i$=v+1 else $S_i$=0, where i=0,1,2, ..., w−1, u=0,1,2, ..., K−1 and v=0,1, 2, ..., d−1.

Figure 4C:
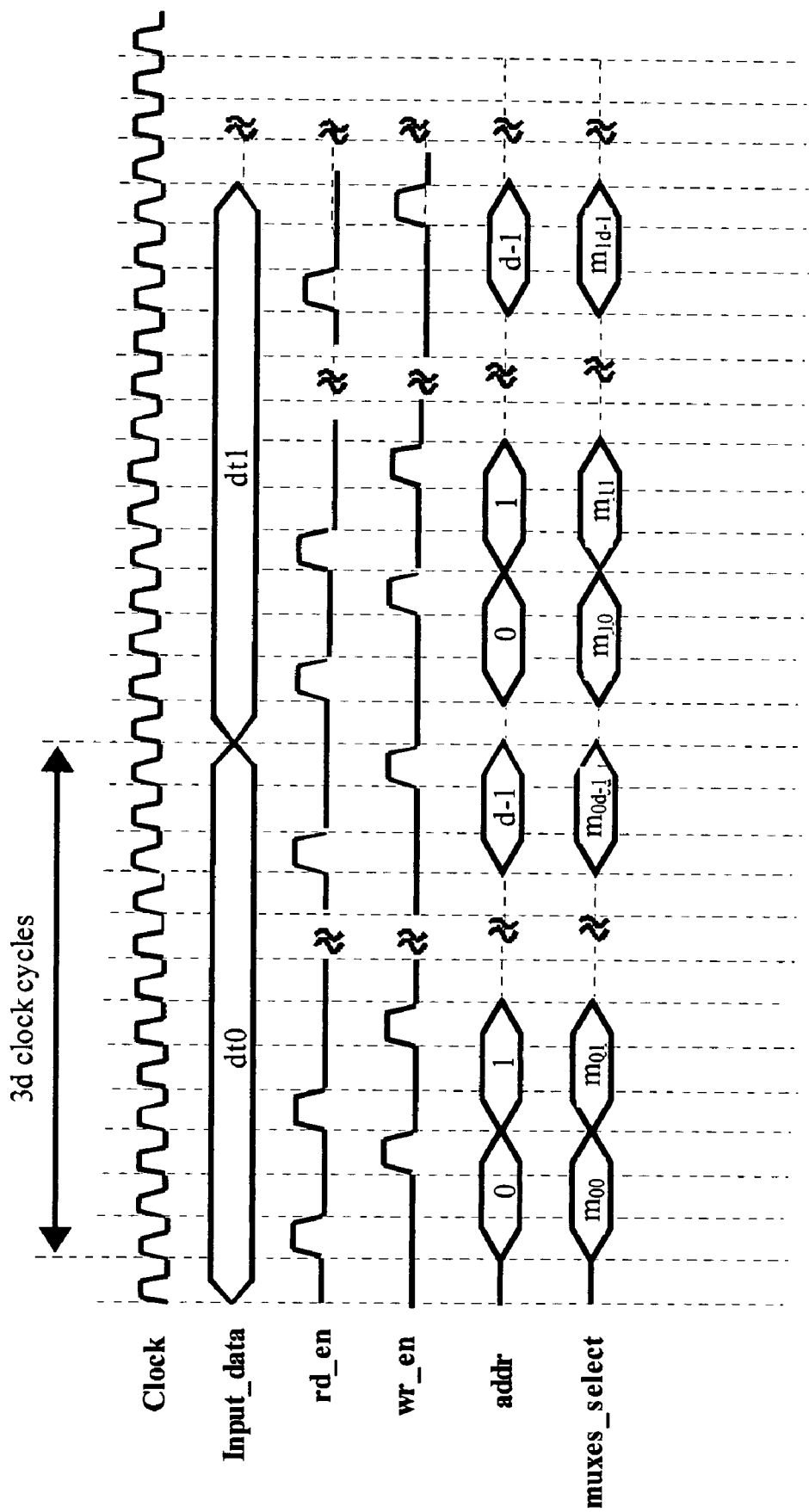
FIG. 4C illustrates a timing diagram of the interleaving operation for the first architecture of an interleaver.

FIG. 4C illustrates a timing diagram of the interleaving operation for the first architecture of an interleaver. The input data 'dt0' is provided to the input bus 408. A read is performed on the standard memory block 401 by asserting read enable through the rd_en signal. The memory content is available in the next clock on read bus 406 that is provided to the input of the multiplexer 402. After the read operation, write enable is asserted through the wr_en signal and the output of the multiplexers 402 is written through the write bus 407. The select input for the multiplexers 402 is provided by the lookup table 403. The steps of reading and writing to the standard memory block 401 are repeated until the permuted data is written into the last location of the standard memory block 401. For every write operation performed on the standard memory block 401 the LUT address is incremented using a control block counter (CB-COUNTER) 413 in the control block 404. After every write performed on the standard memory block 401 the address of the memory is incremented using an address generating counter (AG-COUNTER) 412 in the address generator 405. The select inputs for the multiplexers 402 are $m_{00}$, $m_{01}, m_{02} \ldots, m_{0d-1}$ for input data dt0; $m_{10}, m_{11}, m_{12} \ldots, m_{1d-1}$ for input dt1; and so on. The control signals for the standard memory block 401 and the lookup table 403 are provided by the control block 404. The address generator 405 generates the address for the standard memory block 401.

Reading from the standard memory block 401, and writing the output of the multiplexers 402 is accomplished for 0 through d−1 locations for a standard memory of depth 'd', every time input data is given to the interleaver. Hence '3.*d' clock cycles are needed to interleave 'b' bits of input data, where 'b' indicates input bus width as in FIG. 4B and 3*d*K clock cycles are needed to interleave 'N' bits, where 'N' is the total number of bits to be interleaved and N=b*K. After '3*d*K' clock cycles the interleaved bit sequence is present in the standard memory block 401. The interleaved bits are obtained by performing a read operation from 0 through d−1 locations of the standard memory block 401 requiring 'd' clock cycles. The clock cycles required to finish the entire interleaving operation for 'N' bits is represented by $D_{p1}$=3*d*K+d. The throughput of the interleaver is represented as $T_1$=N/$D_{p1}$ FIG. 4D illustrates a sample output sequence provided by a symbol interleaver for a case in particular with interleaver of size N=300, $m_s$=3, and S=100, where N, $m_s$, and S are as described in Equation 1 in the description of FIG. 3A.

FIG. 4E illustrates a sample output sequence provided by a tone interleaver for a case in particular with interleaver of size N=300, S=100, T=10, and $m_t$=10, where N, S, T, and $m_t$ are as described in Equation 2 in the description of FIG. 3A.

FIG. 4F illustrates a sample output sequence provided by a cyclic interleaver for a case in particular with interleaver of size N=300, S=100, $m_c$=33, and k varying from 0 through 2 for OFDM symbol 1 through symbol 3 respectively, where N, S, $m_c$, and k are as described in Equation 3 in the description of FIG. 3A.

Figure 4G:
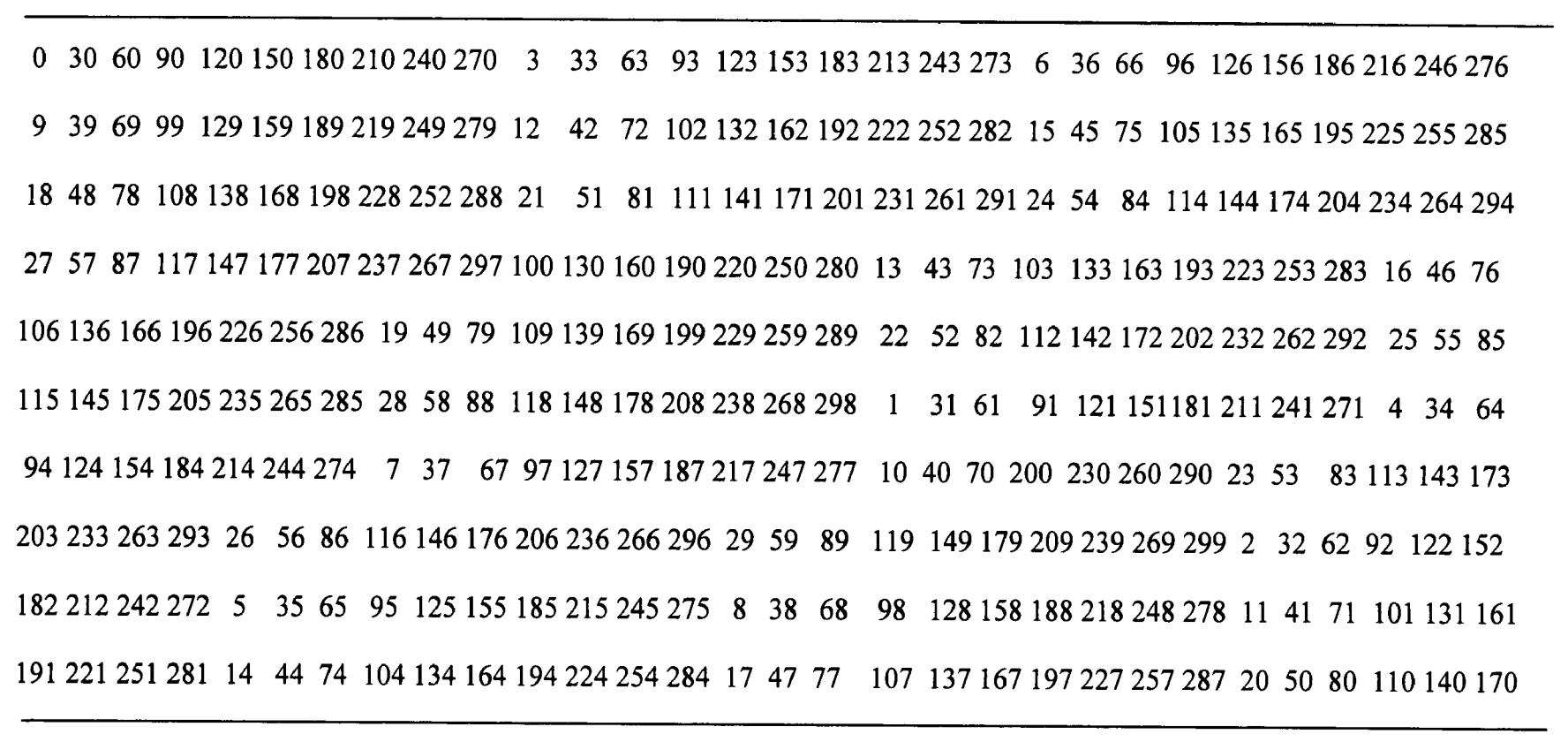

FIG. 4G illustrates the output sequence generated from a combination of symbol interleaving, tone interleaving and cyclic interleaving implemented by the first and second architectures of interleavers. The sequence is generated for a case in particular with interleaver of size N=300, S=100, $m_s$=3, $m_t$=10, T=10, $m_c$=33, and k varying from 0 through 2 as described in Equation 4 in the description of FIG. 3A.

The following example illustrates the combined stage implementation of symbol interleaving, tone interleaving, and cyclic interleaving typically used in OFDM based communication system. The total number of bits to be interleaved N=300 bits and width of the input bus 408 is b=50 bits. The standard memory block 401 has a width w=50 bits and a depth d=6 locations.

FIG. 4H illustrates the indexes of the input bus 408 connected to the multiplexers 402 of the first architecture of interleaver. The indexes $P_{ij}$ of the input bus 408 are indicated with reference to the example of output sequence of FIG. 4G. $P_{ij}$ values are generated with N=300, w=50, d=6 and b=50 as described in Equation 7 in the description of FIG. 4B. The transpose of the matrix is denoted as $[ ]^T$ in FIG. 4H.

Figure 4I:
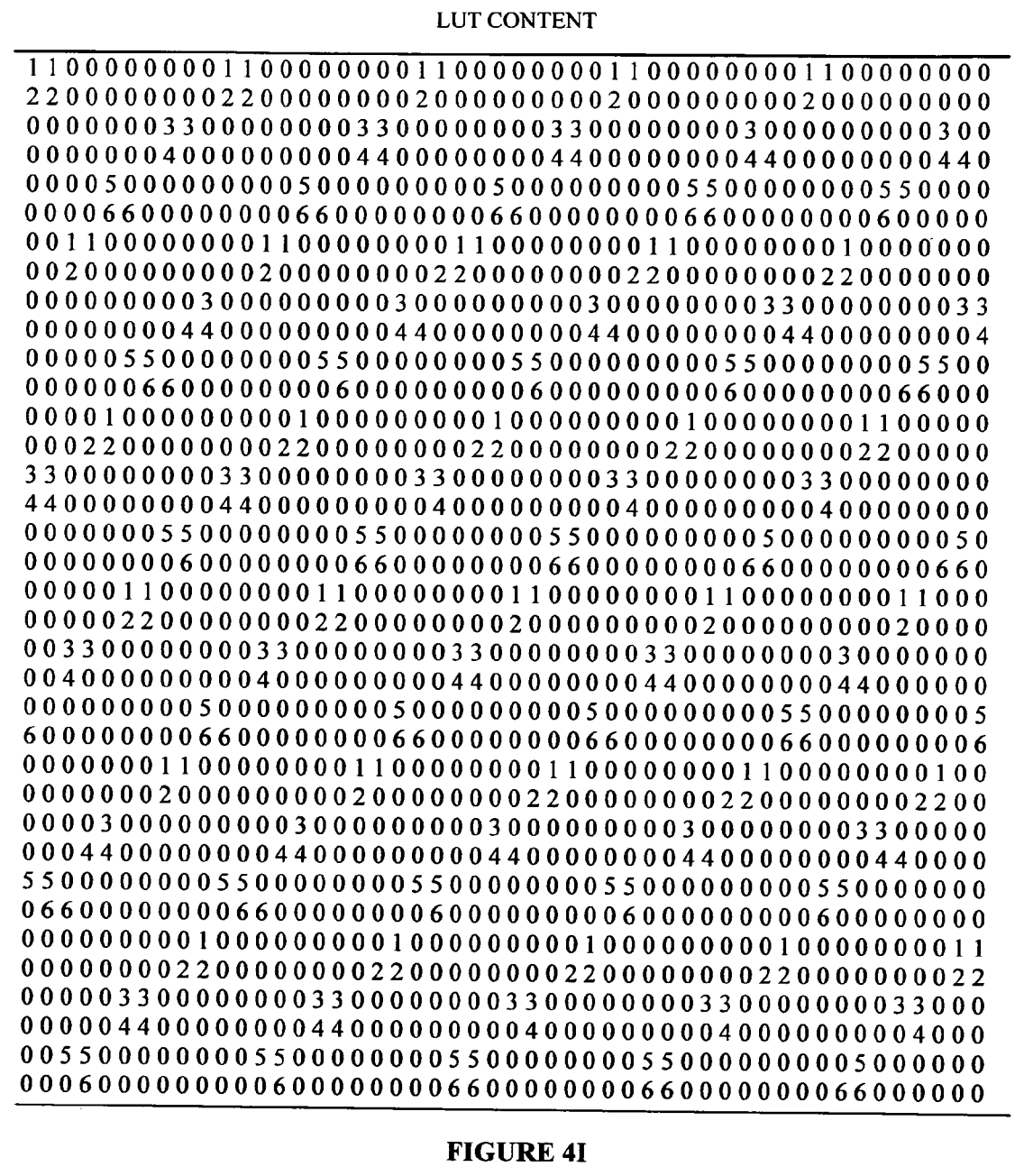

FIG. 4I illustrates the contents of the lookup table 403 with reference to the examples illustrated in FIG. 4G. The contents of the lookup table 403 are generated based on a combination of symbol interleaving, tone interleaving, and cyclic interleaving functions. The select input $m_{uv}$ is generated in FIG. 4I with N=300, w=50, b=50, d=6 as described in Equation 8 in the description of FIG. 4B.

Figure 5A:
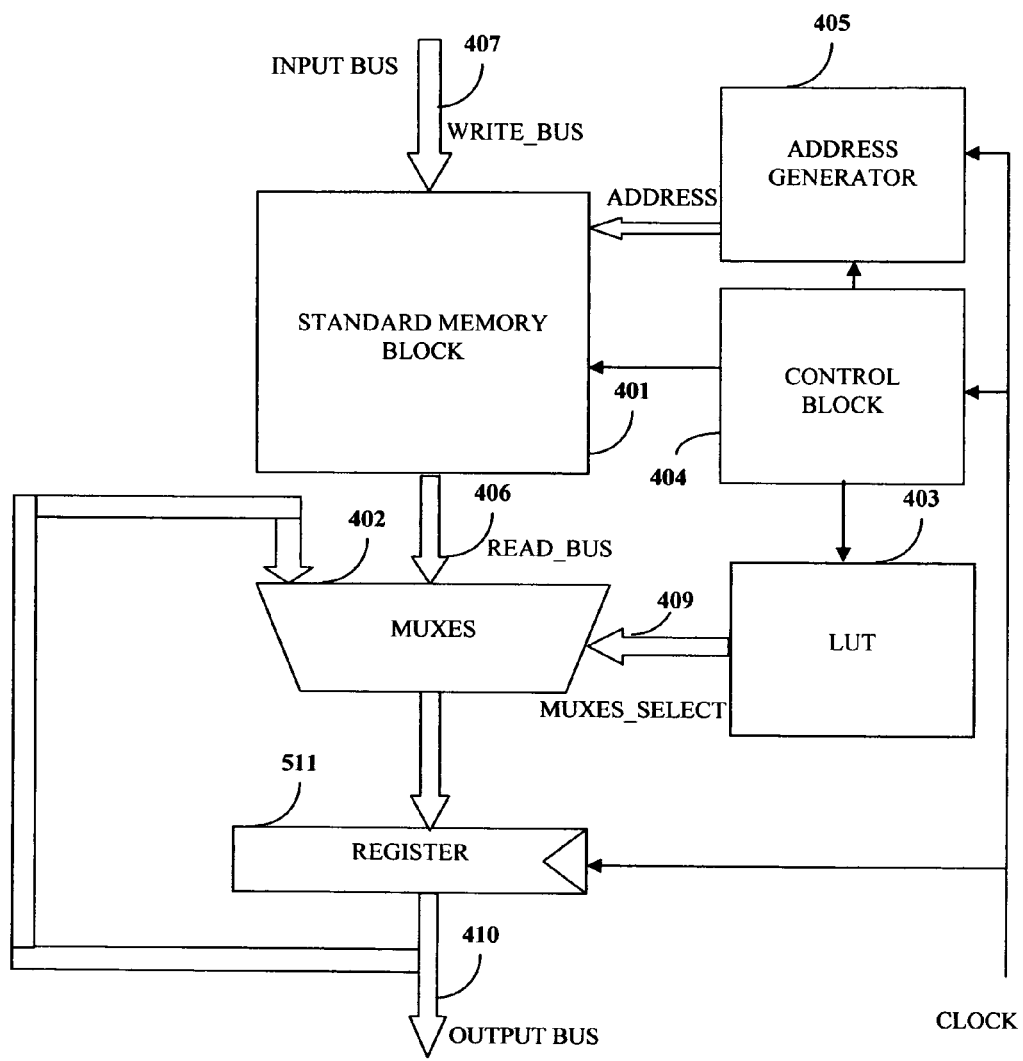
FIG. 5A illustrates an exemplary second architecture of a system for parallel interleaving of data bits by a combined stage implementation for different types of interleaving techniques.

FIG. 5A illustrates an exemplary second architecture of a system for parallel interleaving of data bits by a combined stage implementation for different types of interleaving techniques. The second architecture of the parallel interleaving system assumes that the input to the bit-interleaver is available in a burst at every clock cycle. The system for the second interleaving architecture comprises a standard memory block 401, a plurality of multiplexers 402 connected to a read bus 406, an address generator 405, a lookup table 403, and an output register 511. A control block 404 controls the lookup table 403, the standard memory block 401, and an address generator 405. The lookup table 403 is used for generating the select inputs 409 for the plurality of multiplexers 402. A write bus 407 writes the burst input data to the standard memory block 401 row-wise. The read bus 406 is used to read the data bits located in the standard memory block 401 into the multiplexers 402. The multiplexer output is registered using the output register 511.

The width of the input bus 407 is equal to the width of the standard memory block 401. The standard memory block 401 is of depth 'd' and width 'w' such-that d*w=N, where 'N' is the number of bits to be interleaved. The data bits to be interleaved are provided from the input bus 407 of width 'w' to the standard memory block 401. The output bus 410 is of width 'z' such that N=z*K, where K is an integer. The number of entries in the lookup table 403 will be equal to d*K. The number of clock cycles required for interleaving is $D_{p2}$=d+(d*K). The throughput of the interleaver is represented as $T_2$=N/$D_{p2}$.

Figure 5B:
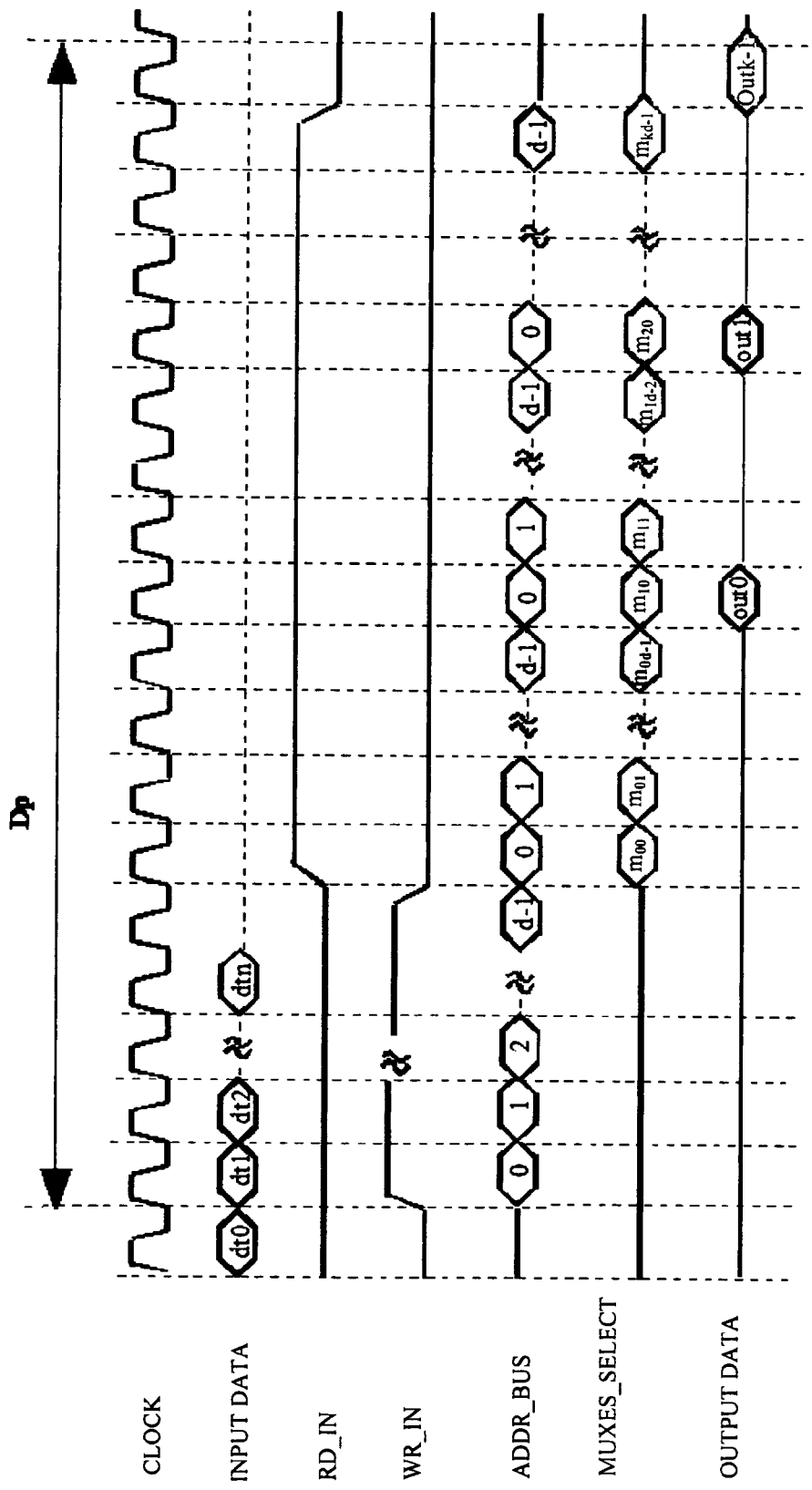
FIG. 5B illustrates a timing diagram for an interleaving operation for a second architecture.

FIG. 5B illustrates a timing diagram for an interleaving operation for the second architecture of the interleaver. The input data arriving in burst is written into the standard memory block 401 in consecutive clock cycles by providing a wr_en signal. The memory is then read from 0 through d−1 locations by providing a rd_en signal and corresponding address on the address bus of the standard memory block 401. Every time a read is performed on the standard memory block 401, the lookup table 403 provides the multiplexer select input 409. The lookup table address is generated by the control block 404 using the CB-COUNTER 413. The multiplexers 402 receive input from the read bus 406 of the standard memory block 401 and the output of the register 511 is fed back to the multiplexers 402, i.e., the first input of each multiplexer 402 is connected to the corresponding bit from the output of the register 511. Based on the select input 409, the output of the multiplexer 402 is either a bit from the read bus 406 or the bit provided to the multiplexer from the register's output. The type of switching process explained above determines the specific bit to be multiplexed by every multiplexer 402 and thereby decides the permutation of the input bit sequence. After a read is performed on the memory from 0 through d−1 locations, the interleaved bit sequence is obtained by reading the output register 511 on the output bus 410. The interleaving operation is repeated until all the bits are interleaved.

The system architecture of FIG. 4A is used if the input data is available for at least 3*d clock cycles, whereas the alternative architecture of FIG. 5A is used when the input data is available for every clock cycle, in a burst. The output data in the system architecture of FIG. 4A, is available for every clock cycle, in a burst, whereas the output data in the alternative architecture of FIG. 5A is available once in every 'd' clock cycles. The system architecture of FIG. 4A requires $D_{p1}$=3*d*K+d clock cycles to interleave 'N' bits of data, while the alternative architecture of FIG. 5A requires $D_{p2}$=d+(d*K) clock cycles.

Figure 6A:
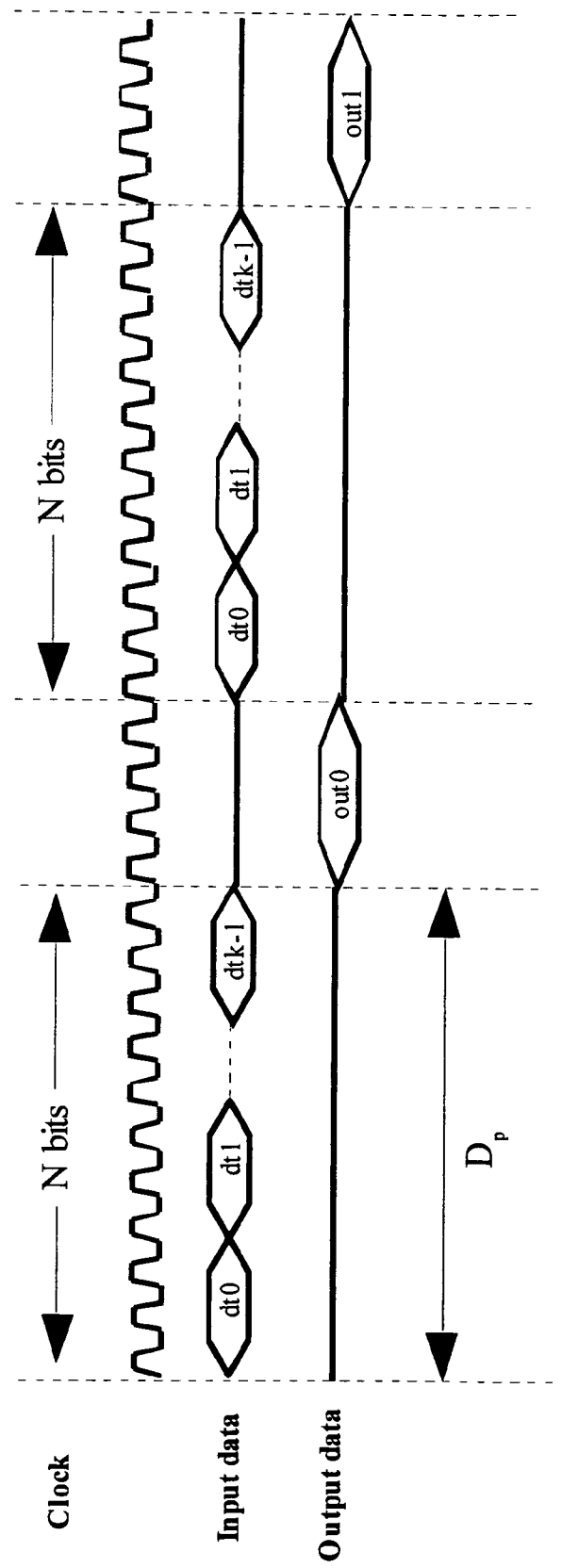
FIG. 6A illustrates the input-output timing diagram for an interleaving operation according to the first architecture, using single-port RAM to store the interleaved bits.

FIG. 6A illustrates the input-output timing diagram for an interleaving operation according to the first architecture, using a single-port RAM to store the interleaved bits. If a single-port RAM is used, the interleaved bits can be obtained by reading the memory locations from 0 through d−1, once the interleaved bits are in the standard memory block 401. Hence $D_{p1}$ clock cycles are required to get the interleaved bit sequence.

Figure 6B:
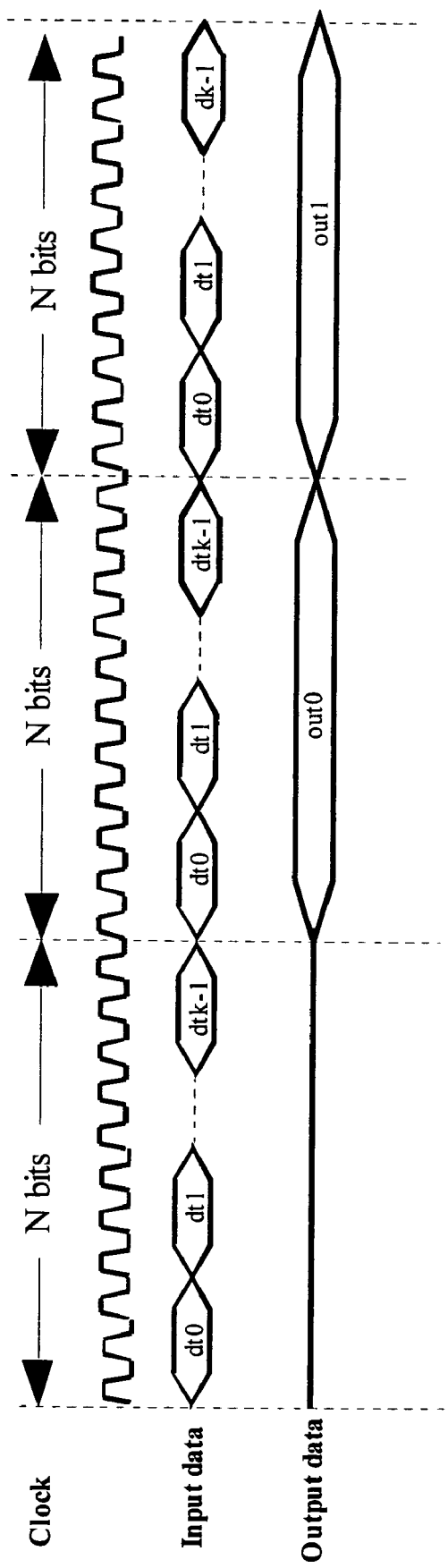
FIG. 6B illustrates the input-output timing diagram for interleaving operation according to the first architecture, using dual-port RAM to store the interleaved bits.

FIG. 6B illustrates the input-output timing diagram for interleaving operation according to the first architecture, using a dual-port RAM (DPRAM) to store the interleaved bits. Using a DPRAM of depth '2d' and width 'w' in the first interleaving architecture, the interleaving of bits and reading from the standard memory block 401 are simultaneously achieved. While the interleaved bits of first set of 'N' bits are read on the second port of the standard memory block 401, the interleaving operation is executed for the second set of 'N' bits on the first port of DPRAM. Hence an implementation with dual port RAM takes a smaller number of clock cycles compared to the single-port RAM implementation. The total number of clock cycles required for interleaving using a dual port RAM is $D_{p1}$-d clock cycles. Similar performance improvement is possible by using a dual port RAM for second architecture shown in FIG. 5A. The number of clock cycles required for interleaving in case of second architecture using dual port RAM is $D_{p2}$-d clock cycles.

FIG. 7A and FIG. 7B illustrates the performance of the first and second interleaving architectures for single stage parallel interleaving respectively. 25 The first interleaving architecture, in the present invention for interleaving and deinterleaving bits of data requires $D_{p1}$=3*d*K+d clock cycles to complete the interleaving operation. Therefore, depending on the requirement in the design, an appropriate value of input bus width 'b' and memory width 'w' is chosen so as to obtain high speed data bit interleaving and less hardware complexity of the'system. The bit length to be interleaved 'N'=b*K, where 'K' is an integer. The different examples of number of bits to be interleaved and the corresponding input bus width 'b', depth 'd' and width 'w' of the standard memory block 401 and the approximated throughput are illustrated in FIG. 7A. Consider an example of bit length to be interleaved N=1200, an input bus 408 of width b=200, depth d=6 and width w=200 of the standard memory block 401. The required clock cycles are $D_{p1}$=3*d*K+d. After calculation, K=6, and the clock cycles required are $D_{p1}$=114. The throughput is given by $T_1$=N/$D_{p1}$. Therefore, the performance of the interleaver is 10.52. The throughput or the performance of the interleaver is approximated to 11. Similarly, the performance for the second architecture can be obtained with an appropriate value for depth 'd', width 'w' of the standard memory block 401 and width 'z' of the output register 511. For an interleaver of size 'N', the width 'z' of the output register is such that N=z*K, where 'K' is an integer. The performance for the second architecture is given by $T_2$=N/$D_{p2}$, where $D_{p2}$=d+(d*K). FIG. 7B discusses different examples and the corresponding performances.

We claim:
1. A method of interleaving of data bits in wireless data communication, said method comprising:
providing a plurality of multiplexers for multiplexing said data bits;
providing a standard memory block with a predetermined memory dimension;
providing an input bus of predetermined data size;

generating contents of a lookup table based on an interleaving function; and permuting the data bits based on said interleaving function for obtaining said interleaved data bits, said step of permuting comprising:

providing an input bit sequence from said data bits commonly to each of said plurality of multiplexers through said input bus;

selecting individual bits of said input bit sequence in a permuted sequence by parallel switching two or more of the plurality of multiplexers based on said contents of said lookup table, wherein selecting individual bits of said input bit sequence based on the interleaving function mapped in the lookup table generates a permuted bit sequence; and writing said permuted bit sequence to said standard memory block through a write bus;

whereby permuting said data bits based on said interleaving function generates an interleaved data bits sequence.

2. The method of claim 1, wherein the interleaving function is one of a symbol interleaving function, a tone interleaving function, a cyclic interleaving function, a block interleaving function, and any combination thereof.

3. The method of claim 1, wherein relationship between the input bit sequence and the interleaved data bits sequence is y[n]=x [f(n)], further wherein f(n) is the interleaving function, y[n] is the interleaved data bits sequence, and x[n] is the input bit sequence, and n=0 to N−1, where N is the number of data bits that are interleaved.

4. The method of claim 3, wherein said f(n) is one of a symbol interleaving function, a tone interleaving function, a cyclic interleaving function, a block interleaving function, and any combination thereof, wherein combined interleaving function $f(n)=f_1(f_2(f_3(n)))$, where $f_1$, $f_2$, and $f_3$ are different types of interleaving functions.

5. The method of claim 1 is optimized based on interleaving performance requirements and to support high data rates in the interleaving of the data bits.

6. The method of claim 1, wherein the bits in the permuted bit sequence are in the interleaved data bits sequence.

7. The method of claim 1, wherein said bit interleaving transforms channel burst errors to random bit errors.

8. The method of claim 1, wherein said writing and reading of the interleaved data bits into the standard memory block is performed row wise.

9. A method of interleaving of data bits in wireless data communication, said method comprising:

providing a standard memory block with a predetermined memory dimension;

providing a plurality of multiplexers for multiplexing said data bits;

providing an output register of predetermined data size;

generating contents of a lookup table based on an interleaving function;

writing the data bits row wise to said standard memory block through a write bus; and permuting said written data bits based on said interleaving function for obtaining said interleaved data bits, wherein said step of permuting comprises:

providing the data bits of each row of the standard memory block as an input bit sequence commonly to each of said plurality of multiplexers through a read bus;

selecting individual bits of said input bit sequence in a permuted sequence by parallelly switching each of the plurality of multiplexers based on the contents of said lookup table, wherein selecting individual bits of said input bit sequence based on the interleaving function mapped in the lookup table generates a permuted data bits sequence; and transferring said permuted data bits sequence to an output register;

whereby permuting said written data bits based on said interleaving function generates an interleaved data bits sequence.

10. A system for interleaving of data bits in wireless data communication, said system comprising:

a plurality of multiplexers for selecting individual bits of an input bit sequence from said data bits;

a standard memory block with a predetermined memory dimension, wherein contents of said standard memory block are accessed by said plurality of multiplexers;

a write bus with a predetermined data size for writing the data bits row wise to the standard memory block;

a read bus with a predetermined data size for reading the data bits row wise from the standard memory block; and a lookup table for generating select signals to the plurality of multiplexers, wherein a permuted data bits sequence is generated by said multiplexers based on an interleaving function mapped in the lookup table, and wherein the bits in the permuted data bits sequence are in an interleaved data bits sequence.

11. The system of claim 10, wherein said wireless data communication comprises one of an Ultra-Wideband, a wireless personal area network, a wireless local area network, and a wireless metropolitan area network.

12. The system of claim 10, wherein the standard memory block is a random access memory, single port random access memory or a dual port random access memory.

13. The system of claim 10 further comprising a control block to generate control signals for said lookup table, the standard memory block and an address generator.

14. The system of claim 13, wherein said control block comprises a control block counter to generate a lookup table address.

15. The system of claim 13, wherein said address generator comprises an address generating counter to address all the memory locations in the standard memory block for read and write operations.

16. The system of claim 10, wherein said lookup table contains switching sequence information used for switching inputs to the plurality of multiplexers.

17. The system of claim 16, wherein said switching sequence information is based on contents of the lookup table generated using said interleaving function.

18. The system of claim 10, is used for de-interleaving of data bits on a receiver side in said wireless data communication.

* * * * *